United States Patent
Huang et al.

(10) Patent No.: US 10,062,947 B2
(45) Date of Patent: Aug. 28, 2018

(54) RF TRANSCEIVER AND RF TRANSMITTER OF THE SAME

(71) Applicant: Realtek Semiconductor Corporation, Hsinchu (TW)

(72) Inventors: Ting-Yao Huang, Taichung (TW); Po-Chih Wang, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/865,284

(22) Filed: Jan. 9, 2018

(65) Prior Publication Data
US 2018/0212296 A1 Jul. 26, 2018

(30) Foreign Application Priority Data
Jan. 26, 2017 (TW) .............................. 106103295 A

(51) Int. Cl.
*H01P 5/16* (2006.01)
*H01F 19/04* (2006.01)
*H03F 3/19* (2006.01)
*H04B 1/04* (2006.01)
*H04B 1/18* (2006.01)
*H03F 1/02* (2006.01)
(Continued)

(52) U.S. Cl.
CPC ............... *H01P 5/16* (2013.01); *H01F 19/04* (2013.01); *H03F 1/0222* (2013.01); *H03F 1/3247* (2013.01); *H03F 3/19* (2013.01); *H03F 3/245* (2013.01); *H03H 7/487* (2013.01); *H04B 1/0458* (2013.01); *H03F 2200/207* (2013.01)

(58) Field of Classification Search
CPC .......... H01P 5/16; H01F 19/04; H03F 1/0222; H03F 1/3247; H03F 3/19; H03F 3/245; H03F 2200/207; H03H 7/487; H04B 1/0458; H04B 1/44; H04B 1/04; H04B 1/18
See application file for complete search history.

(56) References Cited

U.S. PATENT DOCUMENTS 8,472,894 B2    6/2013  Wang et al.
8,892,159 B2 *  11/2014 Ganti ................... H04B 1/0053
                                                      330/277
(Continued)

*Primary Examiner* — Pablo Tran
(74) *Attorney, Agent, or Firm* — CKC & Partners Co., LTD.

(57) ABSTRACT

An RF transmitter with a power combiner and a differential amplifier is provided. The power combiner converts a differential output signal to a single-end output signal and transmits the single-end output signal to the antenna. The differential amplifier includes common-source input transistors, common-gate output transistors and a switch module. The common-source input transistors amplify a differential input signal and output an amplified differential signal. The common-gate output transistors, including sources electrically coupled to the common-source input transistors and drains electrically coupled to the power combiner, generate the differential output signal according to the amplified differential signal. The switch module is electrically coupled between the gates. The switch module electrically couples the gates of the common-gate output transistors if the RF transmitter is in operation and electrically isolates the gates if the RF receiver is in operation.

15 Claims, 4 Drawing Sheets

(51) Int. Cl.
  *H03F 1/32* (2006.01)
  *H03H 7/48* (2006.01)
  *H03F 3/24* (2006.01)

(56) References Cited

U.S. PATENT DOCUMENTS

| | | | |
|---|---|---|---|
| 9,070,506 B2 * | 6/2015 | Anderson | H03F 1/0227 |
| 9,130,636 B2 * | 9/2015 | Chakraborty | H04B 1/0458 |
| 9,520,906 B2 * | 12/2016 | Butterfield | H03F 1/0205 |
| 9,680,513 B2 * | 6/2017 | Nan | H04B 1/18 |
| 9,685,907 B2 * | 6/2017 | Chakraborty | H03B 5/1212 |
| 9,705,536 B2 * | 7/2017 | Fanori | H04B 1/04 |
| 9,723,560 B2 * | 8/2017 | Youssef | H04W 52/0229 |
| 9,882,588 B2 * | 1/2018 | Fong | H03F 1/08 |
| 9,887,673 B2 * | 2/2018 | Park | H03F 1/223 |
| 9,935,663 B1 * | 4/2018 | Rofougaran | H04B 1/0483 |
| 2013/0331048 A1 * | 12/2013 | Tombak | H03F 3/45076 |
| | | | 455/127.2 |
| 2017/0294885 A1 * | 10/2017 | Kang | H03F 1/3241 |

* cited by examiner

RF TRANSCEIVER AND RF TRANSMITTER OF THE SAME

RELATED APPLICATIONS

This application claims priority to Taiwan Application Serial Number 106103295, filed Jan. 26, 2017, which is herein incorporated by reference.

BACKGROUND

Field of Invention

The present disclosure relates to an RF communication technology. More particularly, the present disclosure relates to an RF transceiver and an RF transmitter of the same.

Description of Related Art

In an RF transceiver, the antenna is shared by its RF receiver and RF transmitter when the cost is taken into consideration. Under such a configuration, the RF transmitter is disabled when the RF receiver is in operation, and the RF receiver is disabled when the RF transmitter is in operation. However, when one of the RF transmitter and the RF receiver operates under the radio frequency band, the impedance of the other one of the RF transmitter and the RF receiver is presented. The loss of the circuit is thus increased. Some techniques use impedance matching to enhance the isolation between the RF receiver and the RF transmitter. However, the efficiency of the impedance matching is decreased due to the parasitic capacitors in the RF transceiver. The decreasing of the loss cannot be accomplished.

Accordingly, what is needed is an RF transceiver and an RF transmitter of the same to address the issues mentioned above.

SUMMARY

The disclosure provides an RF transmitter electrically coupled to an antenna. The RF transmitter includes a power combiner and a differential amplifier. The power combiner is configured to convert a differential output signal to a single-end output signal and transmit the single-end output signal to the antenna. The differential amplifier includes a pair of common-source input transistors, a pair of common-gate output transistors and a switch module. The common-source input transistors are configured to amplify a differential input signal and output an amplified differential signal. The common-gate output transistors include a pair of sources electrically coupled to the common-source input transistors, a pair of drains electrically coupled to the power combiner and a pair of gates, wherein the common-gate output transistors are configured to generate the differential output signal according to the amplified differential signal. The switch module is electrically coupled between the gates, wherein the switch module electrically couples the gates of the common-gate output transistors if the RF transmitter is in operation and electrically isolates the gates if the RF receiver is in operation.

The present disclosure provides an RF transceiver. The RF transceiver includes an antenna, an RF receiver and an RF transmitter. The RF receiver is electrically coupled to the antenna. The RF transmitter is electrically coupled to the antenna and includes a power combiner and a differential amplifier. The power combiner is configured to convert a differential output signal to a single-end output signal and transmit the single-end output signal to the antenna. The differential amplifier includes a pair of common-source input transistors, a pair of common-gate output transistors and a switch module. The common-source input transistors are configured to amplify a differential input signal and output an amplified differential signal. The common-gate output transistors include a pair of sources electrically coupled to the common-source input transistors, a pair of drains electrically coupled to the power combiner and a pair of gates, wherein the common-gate output transistors are configured to generate the differential output signal according to the amplified differential signal. The switch module is electrically coupled between the gates, wherein the switch module electrically couples the gates of the common-gate output transistors if the RF transmitter is in operation and electrically isolates the gates if the RF receiver is in operation.

to the present disclosure provides an RF transmitter electrically coupled to an antenna. The RF transmitter includes a power combiner and a differential amplifier. The power combiner is configured to convert a differential output signal to a single-end output signal and transmit the single-end output signal to the antenna. The differential amplifier includes a pair of common-source input transistors, a pair of common-gate output transistors and a capacitor. The common-source input transistors are configured to amplify a differential input signal and output an amplified differential signal. The common-gate output transistors include a pair of sources electrically coupled to the common-source input transistors, a pair of drains electrically coupled to the power combiner and a pair of gates, wherein the common-gate output transistors are configured to generate the differential output signal according to the amplified differential signal. The capacitor is electrically coupled between the gates.

BRIEF DESCRIPTION OF THE DRAWINGS

The disclosure can be more fully understood by reading the following detailed description of the embodiment, with reference made to the accompanying drawings as follows.

DETAILED DESCRIPTION

In order to make the objects, technical solutions and advantages of the present disclosure apparent, diagrams in combination of examples are used to describe the present disclosure in further detail. It should be understood that the specific embodiments described herein are merely examples for explaining the present disclosure and are not intended to limit the present disclosure.

Figure 1:
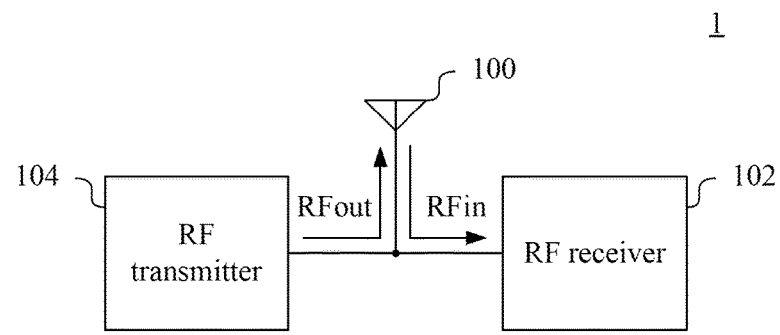
FIG. 1 is a block diagram of an RF transceiver in an embodiment of the present disclosure.

Reference is now made to FIG. 1. FIG. 1 is a block diagram of an RF transceiver 1 in an embodiment of the present disclosure. The RF transceiver 1 includes an antenna 100, an RF receiver 102 and an RF transmitter 104.

Both of the RF receiver 102 and the RF transmitter 104 are electrically coupled to the antenna 100 to share the antenna 100. When the RF receiver 102 is in operation, the RF receiver 102 receives an RF signal RFin from other electronic devices through the antenna 100. When the RF transmitter 104 is in operation, the RF transmitter 104 transmits an RF signal RFout to other electronic devices through the antenna 100.

In an embodiment, when the RF receiver 102 is in operation, the RF transmitter 104 stops operating. When the RF transmitter 104 is in operation, the RF receiver 102 stops operating.

Figure 2A:
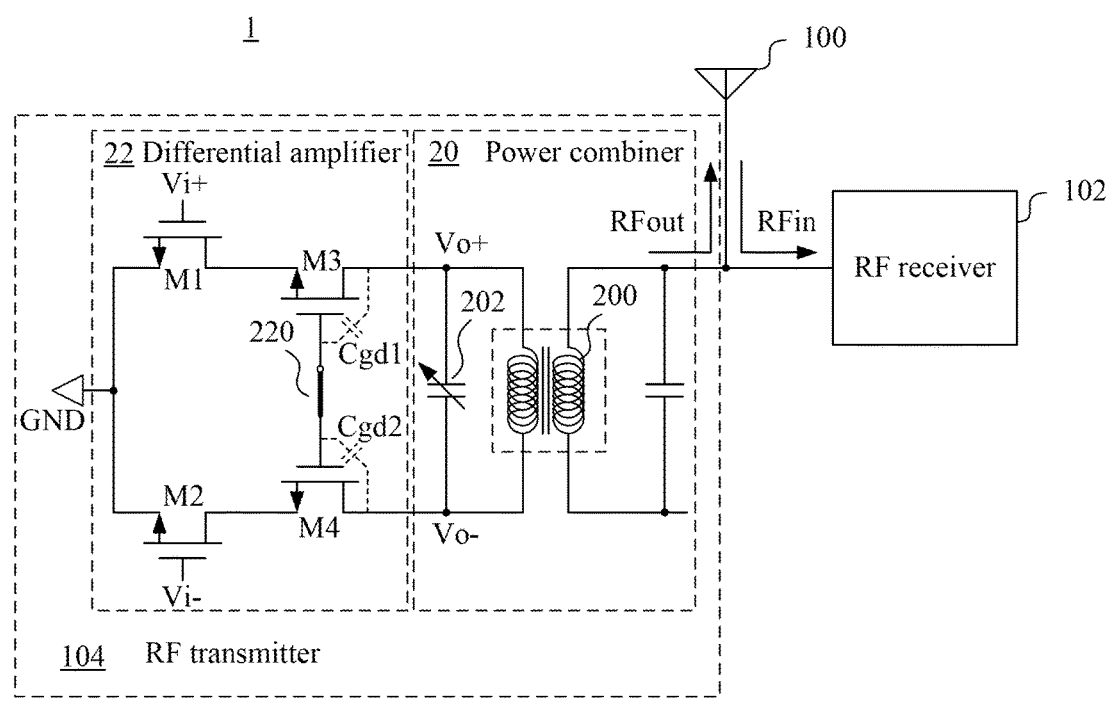
FIG. 2A and FIG. 2B are circuit diagrams of the RF transceiver under different operation status in an embodiment of the present disclosure.
Figure 2B:
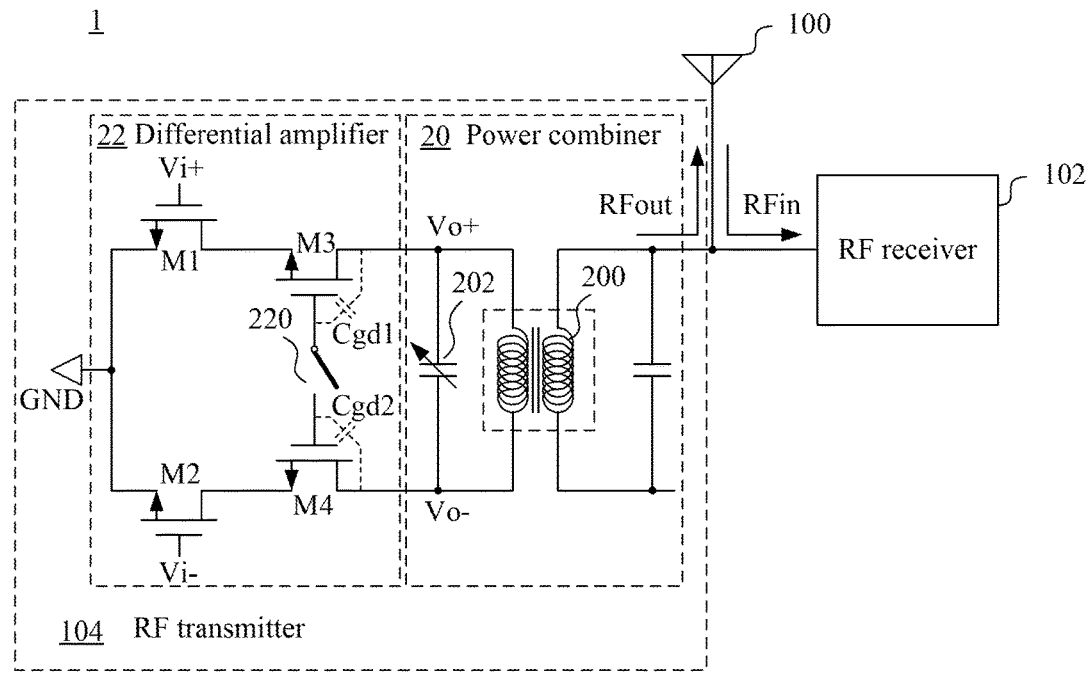

Reference is now made to FIG. 2A and FIG. 2B. FIG. 2A and FIG. 2B are circuit diagrams of the RF transceiver 1 under different operation status in an embodiment of the present disclosure. The frequency transmitter 104 includes a power combiner 20 and a differential amplifier 22.

The power combiner 20 is electrically coupled to the antenna 100 and is configured to convert a differential output signals Vo+ and Vo− from the differential amplifier 22 to a single-end output signal, which is the RF signal RFout and transmit the RF signal RFout to the antenna 100 such that the RF signal RFout is delivered through the antenna 100.

In an embodiment, the power combiner 20 includes a transformer module 200 and a variable capacitor 202. The transformer module 200 includes two transformer inputs configured to receive the differential output signals Vo+ and Vo−, and a transformer output electrically coupled to the antenna 100 and configured to output the RF signal RFout. Since the RF signal RFout is a single-end output signal, it is known by people skilled in the art that an output other than the output connected to the antenna 100 of the transformer module 200 is coupled to a predetermined voltage, e.g., a ground level. The variable capacitor 202 is electrically coupled to the two transformer inputs and is configured to decrease a capacitance thereof when the RF receiver 102 is in operation, such that an equivalent resistance of the transformer module 200 and the variable capacitor 202 becomes a high impedance relative to the RF receiver 202. As a result, under an ideal condition, the signal received by the RF receiver 102 is not affected by the RF transmitter 104 due to the high impedance.

The differential amplifier 22 includes a pair of common-source input transistors M1, M2, a pair of common-gate output transistors M3, M4 and a switch module 220.

In the present embodiment, the common-source input transistors M1 and M2 are N-type MOS transistors and include gates. The common-source input transistors M1 and M2 are configured to amplify differential input signals Vi+ and Vi− and output the amplified signal. Further, the sources of the common-source input transistors M1 and M2 are both electrically coupled to a ground level GND.

The common-source input transistors M3 and M4 include a pair of sources, a pair of drains and a pair of gates. The sources are electrically coupled to the common-source input transistors M1 and M2. The drains are electrically coupled to the transformer inputs of the power combiner 20. The drains generate the differential output signals Vo+ and Vo− according to the amplified differential signals.

In an embodiment, the switch module 220 includes an N-type MOS transistor, a P-type MOS transistor, a transmission gate or a combination thereof. The switch module 220 is disposed between the gates of the common-source input transistors M3 and M4. As illustrated in FIG. 2A, the switch module 220 electrically couples the gates of the common-gate output transistors M3 and M4 when the RF transmitter 104 is in operation such that a short circuit of the alternate current is generated. Further, as illustrated in FIG. 2B, the switch module 220 electrically isolates the gates of the common-gate output transistors M3 and M4 when the RF receiver 102 is in operation, i.e., when the RF transmitter 104 stops operating, such that an open circuit of the alternate current is generated. The parasitic capacitors Cgd1 and Cgd2 between the drains and the gates of the common-gate output transistors M3 and M4 are therefore disconnected during the actual operation status.

As a result, when the RF receiver 102 is in operation, though the variable capacitor 202 in the power combiner 20 can vary the capacitance thereof, the equivalent resistance is easily affected by the parasitic capacitors Cgd1 and Cgd2. The equivalent resistance of the variable capacitor 202, the parasitic capacitors Cgd1, Cgd2 and the transformer module 200 is therefore smaller than the ideal high impedance.

Therefore, by using the design of the switch module 220, the parasitic capacitors Cgd1 and Cgd2 become floating when the RF receiver 102 is in operation. The effect of the parasitic capacitors Cgd1 and Cgd2 on the equivalent resistance of the variable capacitor 202 and the transformer module 200 can be avoided such that the RF receiver 102 can operate normally.

In an embodiment of the present disclosure, each of the common-source input transistors M1 and M2 is a low-voltage device and each of the common-gate output transistors M3 and M4 is a high-voltage device.

Figure 3A:
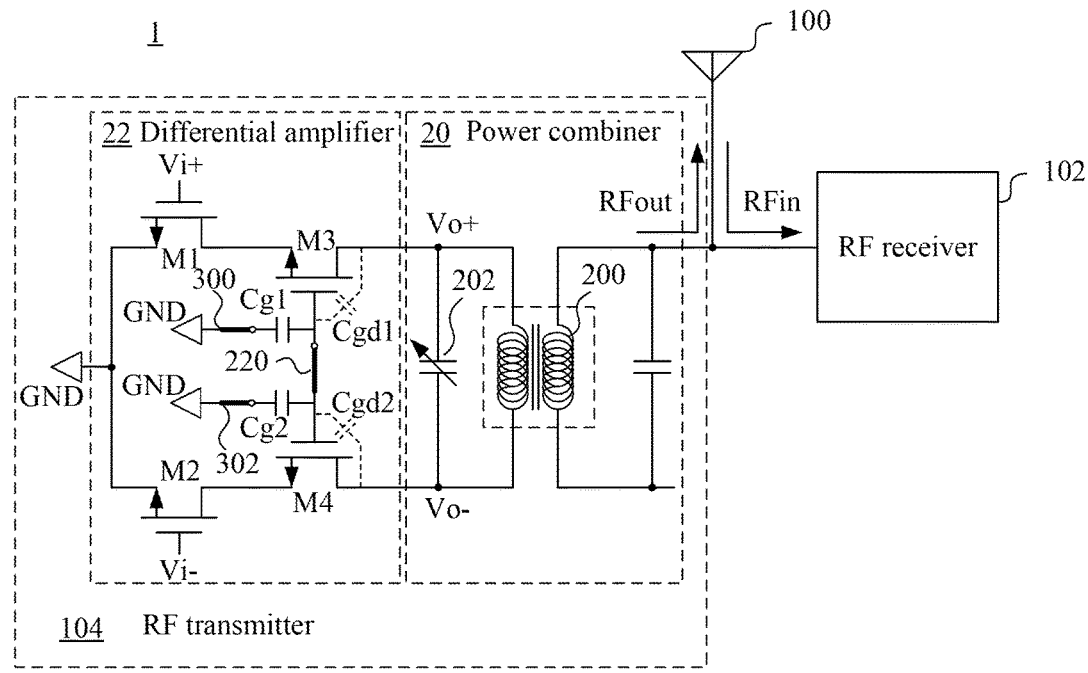
FIG. 3A and FIG. 3B are circuit diagrams of the RF transceiver under different operation status in another embodiment of the present invention.
Figure 3B:
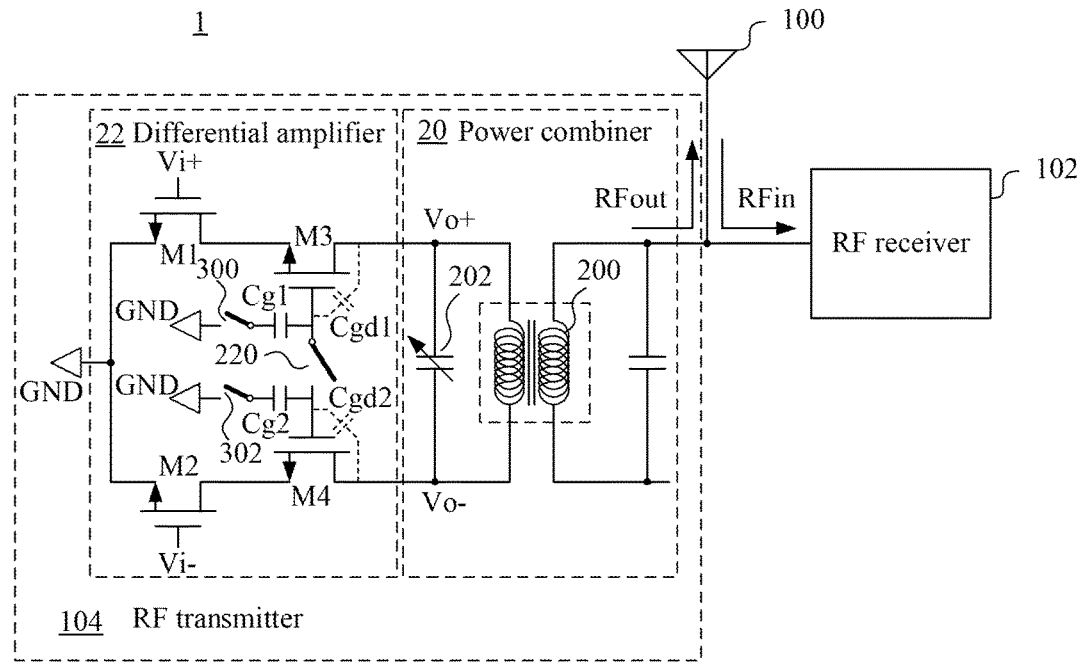

Reference is now made to FIG. 3A and FIG. 3B. FIG. 3A and FIG. 3B are circuit diagrams of the RF transceiver 1 under different operation status in one embodiment of the present disclosure. Similar to the configuration in FIG. 2A and FIG. 2B, the frequency transmitter 104 in FIG. 3A and FIG. 3B also includes the power combiner 20 and the differential amplifier 22. Further, the differential amplifier 22 also includes the common-source input transistors M1, M2, the common-gate output transistors M3, M4 and the switch module 220. As a result, the detail of the identical components is not described herein.

Nevertheless, the differential amplifier 22 in the present embodiment further includes a first grounding capacitor Cg1, a second grounding capacitor Cg2, a first grounding switch module 300 and a second grounding switch module 302.

The first grounding capacitor Cg1 and the second grounding capacitor Cg2 are electrically coupled to the gates of the common-gate output transistors M3 and M4 respectively. The first grounding switch module 300 is disposed between the first grounding capacitor Cg1 and the ground level GND. The second grounding switch module 302 is disposed between the second grounding capacitor Cg2 and the ground level GND.

As illustratively shown in FIG. 3A, the first grounding switch module 300 electrically couples the first grounding capacitor Cg1 to the ground level GND when the RF transmitter 104 is in operation. The second grounding switch module 302 electrically couples the second grounding capacitor Cg2 to the ground level GND when the RF transmitter 104 is in operation.

As illustratively shown in FIG. 3B, the first grounding switch module 300 electrically isolates the first grounding capacitor Cg1 from the ground level GND when the RF receiver 102 is in operation. The second grounding switch module 302 electrically isolates the second grounding capacitor Cg2 from the ground level GND when the RF receiver 102 is in operation.

In some usage scenarios, when the RF transmitter 104 is in operation, the first grounding capacitor Cg1 and the second grounding capacitor Cg2 serve as bypass capacitors to short-circuit the gates of the common-gate output transistors M3 and M4 through the first grounding switch module 300 and the second grounding switch module 302. The gates are electrically coupled to the ground level GND. As a result, disposing the first grounding switch module 300 and the second grounding switch module 302 completely makes the parasitic capacitors Cgd1 and Cgd2 floating when the RF receiver 102 is in operation.

Figure 4A:
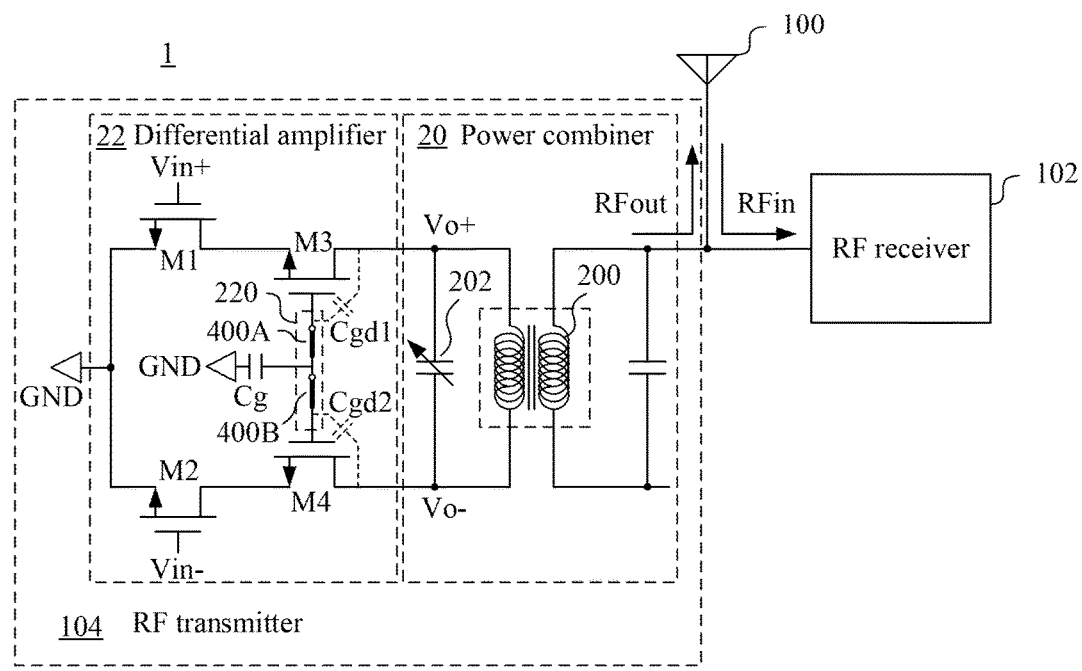
FIG. 4A and FIG. 4B are circuit diagrams of the RF transceiver under different operation status in yet another embodiment of the present disclosure.
Figure 4B:
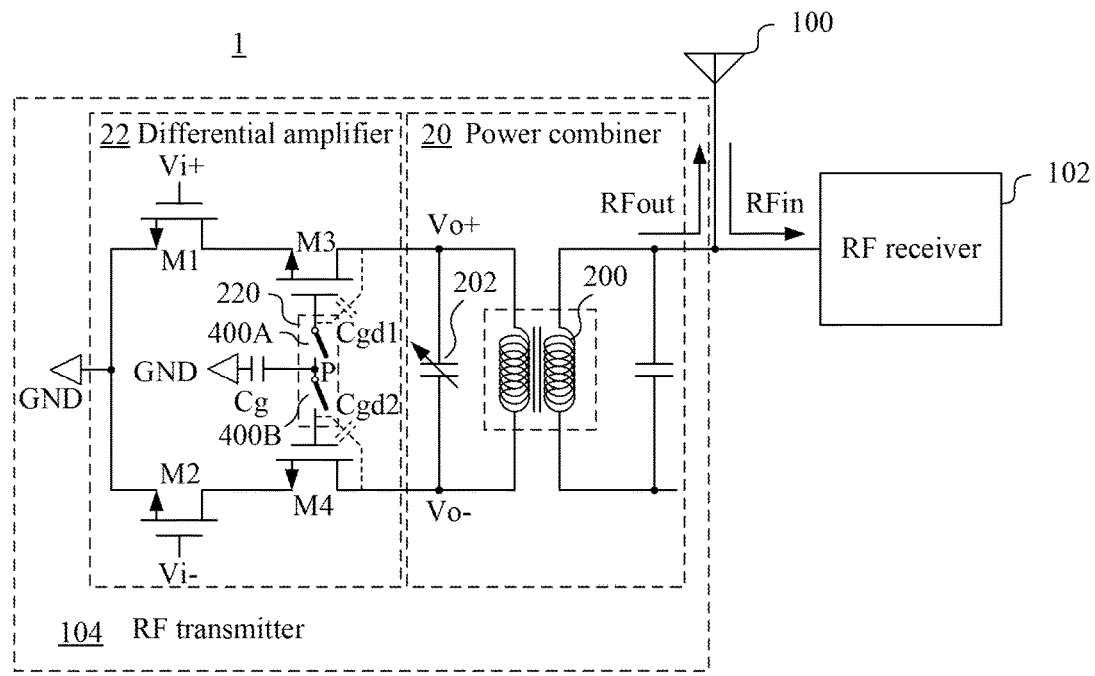

Reference is now made to FIG. 4A and FIG. 4B. FIG. 4A and FIG. 4B are circuit diagrams of the RF transceiver 1 under different operation status in one embodiment of the present disclosure. Similar to the configuration in FIG. 2A and FIG. 2B, the frequency transmitter 104 in FIG. 4A and FIG. 4B also includes the power combiner 20 and the differential amplifier 22. Further, the differential amplifier 22 also includes the common-source input transistors M1, M2, the common-gate output transistors M3, M4 and the switch module 220. As a result, the detail of the identical components is not described herein.

In the present embodiment, the differential amplifier 22 includes a grounding capacitor Cg. The grounding capacitor Cg is electrically coupled to a connection point P and a ground level GND. The switch module 220 further includes a first switch unit 400A and a second switch unit 400B respectively disposed between the gates of the common-gate output transistors M3 and M4 and the connection point P.

As illustratively shown in FIG. 4A, the first switch unit 400A electrically couples the gate of the common-gate output transistor M3 to the connection point P when the RF transmitter 104 is in operation. The second switch unit 400B electrically couples the gate of the common-gate output transistor M4 to the connection point P when the RF transmitter 104 is in operation.

As illustratively shown in FIG. 4B the first switch unit 400A electrically isolates the gate of the common-gate output transistor M3 from the connection point P when the RF receiver 102 is in operation. The second switch unit 400B electrically isolates the gate of the common-gate output transistor M4 from the connection point P when the RF receiver 102 is in operation.

In some usage scenarios, when the RF transmitter 104 is in operation, the grounding capacitor Cg serves as a bypass capacitor to short-circuit the gates of the common-gate output transistors M3 and M4 through the first switch unit 400A and the second switch unit 400B. The gates are electrically coupled to the ground level GND. As a result, disposing the first switch unit 400A and the second switch unit 400B completely makes the parasitic capacitors Cgd1 and Cgd2 floating when the RF receiver 102 is in operation.

Figure 5:
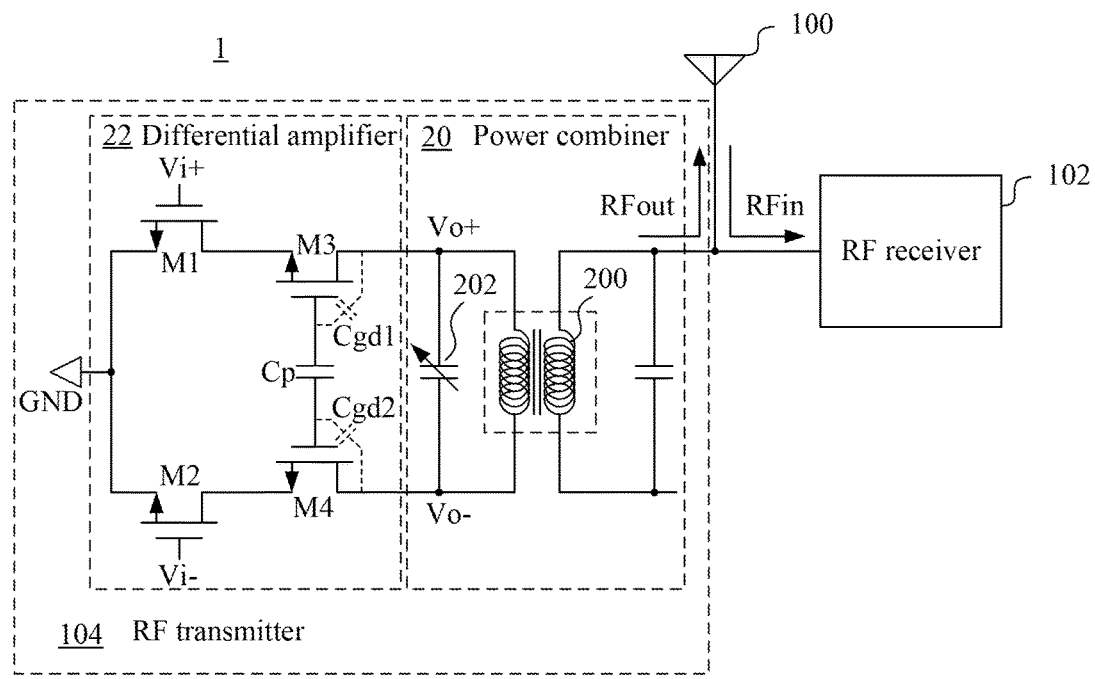
FIG. 5 is a circuit diagram of the RF transceiver in another embodiment of the present disclosure.

Reference is now made to FIG. 5. FIG. 5 is a circuit diagram of the RF transceiver 1 in one embodiment of the present disclosure. Similar to the configuration in FIG. 2A and FIG. 2B, the frequency transmitter 104 in FIG. 5 also includes the power combiner 20 and the differential amplifier 22. Further, the differential amplifier 22 also includes the common-source input transistors M1, M2 and the common-gate output transistors M3, M4. As a result, the detail of the identical components is not described herein.

Nevertheless, the differential amplifier 22 in the present embodiment includes a capacitor Cp instead of the switch module 220.

The capacitor Cp is electrically coupled between the gates of the common-gate output transistors M3 and M4 to electrically couple the parasitic capacitors Cgd1 and Cgd2 in series. As a result, the total capacitance of the parasitic capacitors Cgd1, Cgd2 and the capacitor Cp is smaller than the parasitic capacitance of the parasitic capacitors Cgd1 and Cgd2.

As a result, by disposing the capacitor Cp, the effect of the parasitic capacitors Cgd1 and Cgd2 on the variable capacitor 202 can be decreased. The decrease of the equivalent capacitance of the variable capacitor 202 and the transformer module 200 due to the presence of the parasitic capacitors Cgd1 and Cgd2 can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An RF transmitter electrically coupled to an antenna, wherein the RF transmitter comprises:
    a power combiner configured to convert a differential output signal to a single-end output signal and transmit the single-end output signal to the antenna; and
    a differential amplifier comprising:
        a pair of common-source input transistors configured to amplify a differential input signal and output an amplified differential signal;
        a pair of common-gate output transistors comprising a pair of sources electrically coupled to the common-source input transistors, a pair of drains electrically coupled to the power combiner, and a pair of gates, wherein the common-gate output transistors are configured to generate the differential output signal according to the amplified differential signal; and
        a switch module electrically coupled between the gates, wherein the switch module electrically couples the gates of the common-gate output transistors if the RF transmitter is in operation, and electrically isolates the gates if the RF receiver is in operation.

2. The RF transmitter of claim 1, wherein the differential amplifier further comprises:
    a first grounding capacitor and a second grounding capacitor electrically coupled to the gates of the common-gate output transistors respectively; and
    a first grounding switch module and a second grounding switch module respectively disposed between the first grounding capacitor and a ground level and between the second grounding capacitor and the ground level;
    wherein the first grounding switch module and the second grounding switch module electrically couple the first grounding capacitor and the second grounding capacitor to the ground level respectively if the RF transmitter is in operation, and the first grounding switch module and the second grounding switch module electrically isolate the first grounding capacitor and the second grounding capacitor from the ground level if the RF receiver is in operation.

3. The RF transmitter of claim 1, wherein the differential amplifier further comprises a grounding capacitor electrically coupled to a connection point and a ground level, and the switch module further comprises a first switch unit and a second switch unit respectively disposed between the gates and the connection point;
    wherein the first switch unit and the second switch unit electrically couple the gates to the connection point if the RF transmitter is in operation, and the first switch unit and the second switch unit electrically isolates the gates from the connection point if the RF receiver is in operation.

4. The RF transmitter of claim 1, wherein the switch module comprises an N-type metal-oxide semiconductor (MOS) transistor, a P-type MOS transistor, a transmission gate or a combination thereof.

5. The RF transmitter of claim 1, wherein the switch module is configured to force a pair of parasitic capacitors between the drains and the gates of the common-gate output transistors floating.

6. The RF transmitter of claim 1, wherein the power combiner comprises:
   a transformer module comprising two transformer inputs electrically coupled to the drains of the common-gate output transistors and a transformer output electrically coupled to the antenna; and
   a variable capacitor electrically coupled to the two transformer inputs and configured to decrease a capacitance if the RF receiver is in operation such that an equivalent resistance of the transformer module and the variable capacitor becomes a high impedance relative to the RF receiver.

7. The RF transmitter of claim 1, wherein each of the common-source input transistors is a low-voltage device and each of the common-gate output transistors is a high-voltage device.

8. An RF transceiver comprising:
   an antenna;
   an RF receiver electrically coupled to the antenna; and
   an RF transmitter electrically coupled to the antenna and comprising:
      a power combiner configured to convert a differential output signal to a single-end output signal and transmit the single-end output signal to the antenna; and
      a differential amplifier comprising:
         a pair of common-source input transistors configured to amplify a differential input signal and output an amplified differential signal;
         a pair of common-gate output transistors comprising a pair of sources electrically coupled to the common-source input transistors, a pair of drains electrically coupled to the power combiner and a pair of gates, wherein the common-gate output transistors are configured to generate the differential output signal according to the amplified differential signal; and
         a switch module electrically coupled between the gates, wherein the switch module electrically couples the gates of the common-gate output transistors if the RF transmitter is in operation and electrically isolates the gates if the RF receiver is in operation.

9. The RF transceiver of claim 8, wherein the differential amplifier further comprises:
   a first grounding capacitor and a second grounding capacitor electrically coupled to the gates of the common-gate output transistors respectively; and
   a first grounding switch module and a second grounding switch module respectively disposed between the first grounding capacitor and a ground level and between the second grounding capacitor and the ground level;
   wherein the first grounding switch module and the second grounding switch module electrically couple the first grounding capacitor and the second grounding capacitor to the ground level respectively if the RF transmitter is in operation, and the first grounding switch module and the second grounding switch module electrically isolate the first grounding capacitor and the second grounding capacitor from the ground level if the RF receiver is in operation.

10. The RF transceiver of claim 8, wherein the differential amplifier further comprises a grounding capacitor electrically coupled to a connection point and a ground level, and the switch module further comprises a first switch unit and a second switch unit respectively disposed between the gates and the connection point;
   wherein the switch module electrically couples the gates to the connection point if the RF transmitter is in operation, and the switch module electrically isolates the gates from the connection point if the RF receiver is in operation.

11. The RF transceiver of claim 8, wherein the switch module comprises an N-type MOS transistor, a P-type MOS transistor, a transmission gate or a combination thereof.

12. The RF transceiver of claim 8, wherein the switch module is configured to force a pair of parasitic capacitors between the drains and the gates of the common-gate output transistors floating.

13. The RF transceiver of claim 8, wherein the power combiner comprises:
   a transformer module comprising two transformer inputs electrically coupled to the drains of the common-gate output transistors and a transformer output electrically coupled to the antenna; and
   a variable capacitor electrically coupled to the two transformer inputs and configured to decrease a capacitance if the RF receiver is in operation such that an equivalent resistance of the transformer module and the variable capacitor becomes a high impedance relative to the RF receiver.

14. The RF transceiver of claim 8, wherein each of the common-source input transistors is a low-voltage device and each of the common-gate output transistors is a high-voltage device.

15. An RF transmitter electrically coupled to an antenna, wherein the RF transmitter comprises:
   a power combiner configured to convert a differential output signal to a single-end output signal and transmit the single-end output signal to the antenna; and
   a differential amplifier comprising:
      a pair of common-source input transistors configured to amplify a differential input signal and output an amplified differential signal;
      a pair of common-gate output transistors comprising a pair of sources electrically coupled to the common-source input transistors, a pair of drains electrically coupled to the power combiner and a pair of gates, wherein the common-gate output transistors are configured to generate the differential output signal according to the amplified differential signal; and
      a capacitor electrically coupled between the gates.

* * * * *